US010935570B2

(12) United States Patent
Fujihara et al.

(10) Patent No.: US 10,935,570 B2
(45) Date of Patent: Mar. 2, 2021

(54) INTERMEDIATE CONNECTION MEMBER AND INSPECTION APPARATUS

(71) Applicant: TOKYO ELECTRON LIMITED, Tokyo (JP)

(72) Inventors: Jun Fujihara, Nirasaki (JP); Hiroaki Sakamoto, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/506,041

(22) Filed: Jul. 9, 2019

(65) Prior Publication Data

US 2020/0018778 A1 Jan. 16, 2020

(30) Foreign Application Priority Data

Jul. 13, 2018 (JP) .............................. JP2018-133055
Dec. 18, 2018 (JP) .............................. JP2018-236206

(51) Int. Cl.
| | |
|---|---|
| *G01R 1/04* | (2006.01) |
| *G01R 1/067* | (2006.01) |
| *G01R 1/073* | (2006.01) |
| *G01R 1/20* | (2006.01) |
| *G01R 31/27* | (2006.01) |
| *G01R 31/28* | (2006.01) |

(52) U.S. Cl.
CPC .......... *G01R 1/0416* (2013.01); *G01R 1/0491* (2013.01); *G01R 1/07342* (2013.01)

(58) Field of Classification Search
CPC .......... G01R 1/04; G01R 1/067; G01R 1/073; G01R 1/07314; G01R 1/07342; G01R 1/07378; G01R 1/20; G01R 31/27; G01R 31/28
See application file for complete search history.

(56) References Cited

U.S. PATENT DOCUMENTS

| 2005/0280428 A1* | 12/2005 | Ishikawa ............ G01R 1/06722 |
| | | 324/750.16 |
| 2007/0024305 A1* | 2/2007 | Kim .................... G01R 1/06794 |
| | | 324/750.01 |

(Continued)

FOREIGN PATENT DOCUMENTS

JP 2014-179379 A 9/2014

*Primary Examiner* — Neel D Shah
(74) *Attorney, Agent, or Firm* — Nath, Goldberg & Meyer; Jerald L. Meyer

(57) ABSTRACT

There is provided an intermediate connection member which is provided between a first member having a plurality of first terminals and a second member having a plurality of second terminals and electrically connects the plurality of first terminals and the plurality of second terminals, respectively, the intermediate connection member including: a pogo block including a main body and a plurality of pogo pins provided in the main body, the pogo block configured to connect the plurality of first terminals and the plurality of second terminals, respectively; and a pogo frame having an insertion hole into which the pogo block is inserted, wherein the pogo block has a positioning pin, and the pogo frame has a positioning hole into which the positioning pin is inserted, and wherein the pogo block is positioned with respect to the pogo frame when the positioning pin is inserted into the positioning hole.

12 Claims, 4 Drawing Sheets

(56) References Cited

U.S. PATENT DOCUMENTS

| | | | | |
|---|---|---|---|---|
| 2013/0093453 A1* | 4/2013 | Sakata | ............... | G01R 1/0491 |
| | | | | 324/756.03 |
| 2014/0333334 A1* | 11/2014 | Akahori | ............ | G01R 31/2886 |
| | | | | 324/750.25 |
| 2015/0008946 A1* | 1/2015 | Inoue | ............... | G01R 1/07342 |
| | | | | 324/750.03 |
| 2015/0219710 A1* | 8/2015 | Lee | ..................... | G01R 1/073 |
| | | | | 324/756.03 |
| 2016/0069951 A1* | 3/2016 | Yamada | ............ | G01R 31/2891 |
| | | | | 324/750.2 |

\* cited by examiner

INTERMEDIATE CONNECTION MEMBER AND INSPECTION APPARATUS

CROSS-REFERENCE TO RELATED APPLICATIONS

This application is based upon and claims the benefit of priority from Japanese Patent Application Nos. 2018-133055 and 2018-236206, filed on Jul. 13, 2018, and Dec. 18, 2018, respectively, the entire contents of which are incorporated herein by reference.

TECHNICAL FIELD

The present disclosure relates to an intermediate connection member and an inspection apparatus.

BACKGROUND

In a semiconductor device manufacturing process, electrical inspection of a plurality of devices (IC chips) formed on a semiconductor wafer (hereinafter simply referred to as a wafer) is performed at a stage where all processes for the wafer are completed. An inspection apparatus that performs such electrical inspection generally includes a wafer stage, an aligner for aligning a wafer, a wafer transfer system, a prober on which a probe card having probes that come into contact with devices formed on the wafer is mounted, and a tester for applying electrical signals to the devices through the probe card to test various electrical characteristics of the devices.

Such an inspection apparatus is provided with an intermediate connection member to make electrical conduction between the tester (test head) and the probe card. It is known that the intermediate connection member includes a plurality of pogo blocks formed with a number of arranged pogo pins, and a pogo frame having a plurality of insertion holes into which the pogo blocks are inserted (see, e.g., Patent Document 1).

RELATED ART DOCUMENT

Patent Documents

[Patent Document 1] Japanese Patent Laid-Open Publication No. 2014-179379

SUMMARY

Some embodiments of the present disclosure provide a technique capable of suppressing positional deviation between a pogo frame and a pogo block due to a difference in thermal expansion therebetween using an intermediate connection member configured by inserting the pogo block into an insertion hole of the pogo frame.

According to one embodiment of the present disclosure, there is provided an intermediate connection member which is provided between a first member having a plurality of first terminals and a second member having a plurality of second terminals and electrically connects the plurality of first terminals and the plurality of second terminals, respectively, the intermediate connection member including: a pogo block including a main body and a plurality of pogo pins provided in the main body, the pogo block configured to connect the plurality of first terminals and the plurality of second terminals, respectively; and a pogo frame having an insertion hole into which the pogo block is inserted, wherein the pogo block has a positioning pin, and the pogo frame has a positioning hole into which the positioning pin is inserted, and wherein the pogo block is positioned with respect to the pogo frame when the positioning pin is inserted into the positioning hole.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Hereinafter, an embodiment of the present disclosure will be described with reference to the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
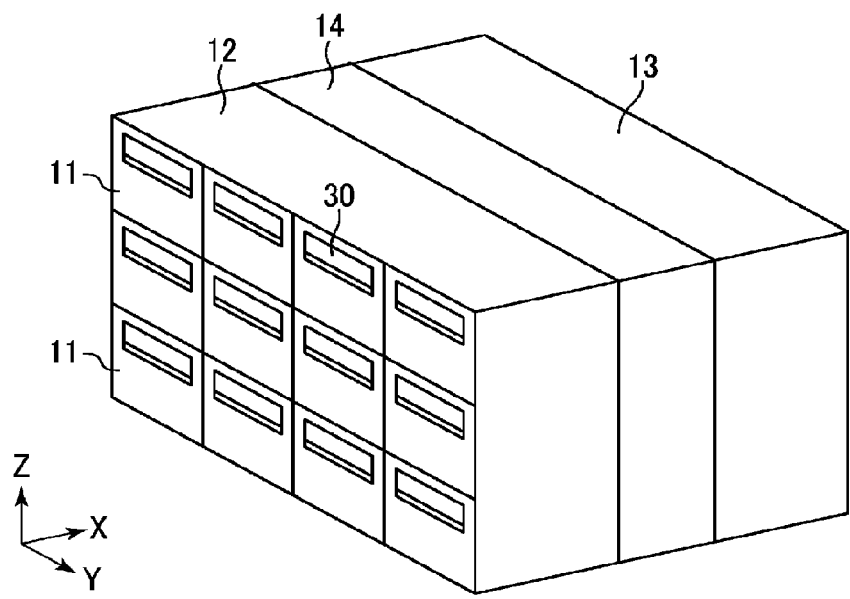
FIG. 1 is a perspective view schematically showing an exemplary configuration of an inspection system.

FIG. 1 is a perspective view schematically showing an example of an inspection system on which a plurality of inspection apparatuses according to an embodiment is mounted. The inspection system 10 of the present embodiment is provided to inspect the electrical characteristics of a plurality of devices under test (DUTs) formed on a semiconductor wafer (wafer) which is an inspection object.

The inspection system 10 of FIG. 1 has a rectangular parallelepiped shape as a whole and includes an inspection part 12 having a plurality of inspection rooms (cells) 11, and a loader part 13 that loads/unloads a wafer W into/from each of the inspection rooms 11. In the inspection part 12, four inspection rooms 11 are arranged in the horizontal direction to form a cell row. The cell rows thus formed are arranged in three stages in the vertical direction. Further, a transfer part 14 is provided between the inspection part 12 and the loader part 13. A transfer mechanism (not shown) for delivering the wafer W between the loader part 13 and each of the inspection rooms 11 is provided inside the transfer part 14. An inspection apparatus to be described later is provided inside each of inspection rooms 11. A tester 30, which is a portion of the inspection apparatus, is inserted into each of the inspection rooms 11 from the front side of the inspection part 12. In FIG. 1, the depth direction of the inspection room 11 is defined as an X direction, the arrangement direction of the inspection rooms 11 is defined as a Y direction, and the height direction is defined as a Z direction.

Figure 2:
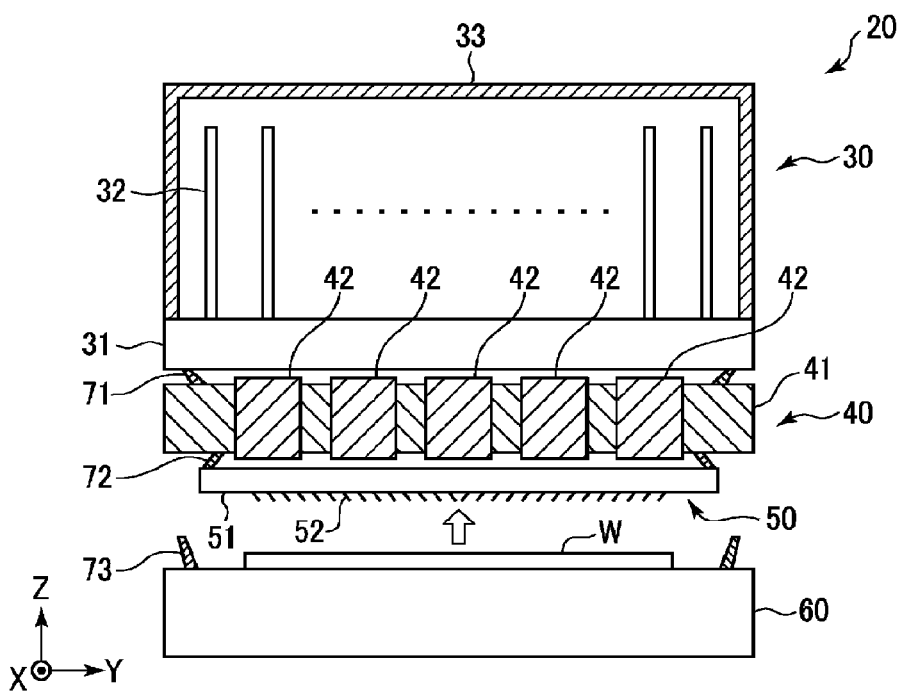
FIG. 2 is a schematic sectional view showing an inspection apparatus provided in the inspection system of FIG. 1.

FIG. 2 is a schematic configuration view showing an inspection apparatus provided inside the inspection room 11. An inspection apparatus 20 includes a tester 30, an intermediate connection member 40 and a probe card 50. In the inspection apparatus 20, the electrical characteristics of the DUTs formed on the wafer W is inspected by the tester 30 via the probe card 50.

The tester 30 includes a tester mother board 31 provided horizontally, a plurality of test circuit boards 32 mounted upright in slots of the tester mother board 31, and a housing 33 in which the test circuit boards 32 are accommodated. A plurality of terminals (not shown) is provided in bottom of the tester mother board 31.

The probe card 50 includes a plate-like base 51 having a plurality of terminals (not shown) formed on the upper surface thereof, and a plurality of probes 52 provided on the lower surface of the base 51. The plurality of probes 52 are in contact with the DUTs formed on the wafer W. The wafer W is positioned by an aligner (not shown) in a state where the wafer W is attracted onto a chuck top (stage) 60, and the probes are in contact with the plurality of DUTs, respectively.

The intermediate connection member 40 is provided to electrically connect the tester 30 and the probe card 50 and includes a pogo frame 41 and pogo blocks 42.

Figure 3:
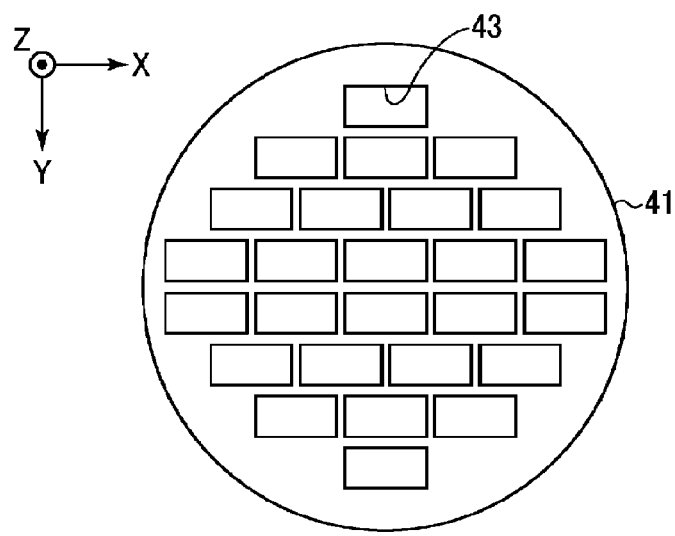
FIG. 3 is a plan view showing a pogo frame of an intermediate connection member in the inspection apparatus of FIG. 2.

The pogo frame 41 is made of a material having high strength, high rigidity and a small thermal expansion coefficient, such as a NiFe alloy. As shown in FIG. 3, the pogo frame 41 has a plurality of rectangular insertion holes 43 formed therein. The pogo blocks 42 are inserted into the insertion holes 43, respectively.

The pogo blocks 42 are positioned with respect to the pogo frame 41, as will be described later, and connect the terminals of the tester motherboard 31 in the tester 30 and the terminals of the base 51 in the probe card 50.

A seal member 71 is provided between the tester mother board 31 and the pogo frame 41, and a seal member 72 is provided between the pogo frame 41 and the probe card 50. A space between the tester mother board 31 and the intermediate connection member 40 is evacuated, whereby the intermediate connection member 40 is attracted onto the tester mother board 31 via the seal member 71. Further, a space between the intermediate connection member 40 and the probe card 50 is evacuated, whereby the probe card 50 is attracted onto the intermediate connection member 40 (the pogo frame 41) via the seal member 72. A seal member 73 is provided on an upper surface of the chuck top 60 so as to surround the wafer W. The chuck top 60 is raised by an aligner (not shown) provided in each stage to bring the probes 52 of the probe card 50 into contact with the electrodes of the DUTs formed on the wafer W. At the same time, the chuck top 60 is attracted by bringing the seal member 73 into contact with the pogo frame 41 of the intermediate connection member 40 and evacuating a space surrounded by the seal member 73.

Next, the intermediate connection member 40, particularly the pogo blocks 42, will be described in detail.

Figure 4:
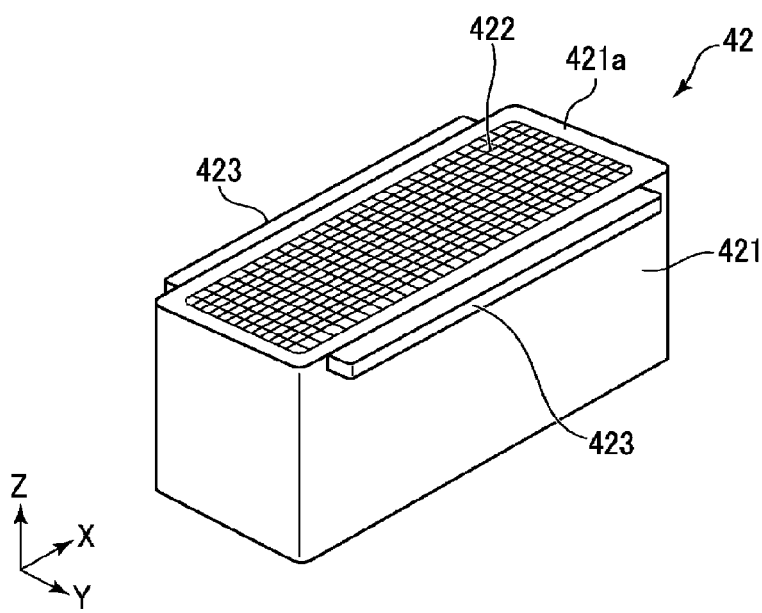
FIG. 4 is a perspective view showing a pogo block of the intermediate connection member.
Figure 5:
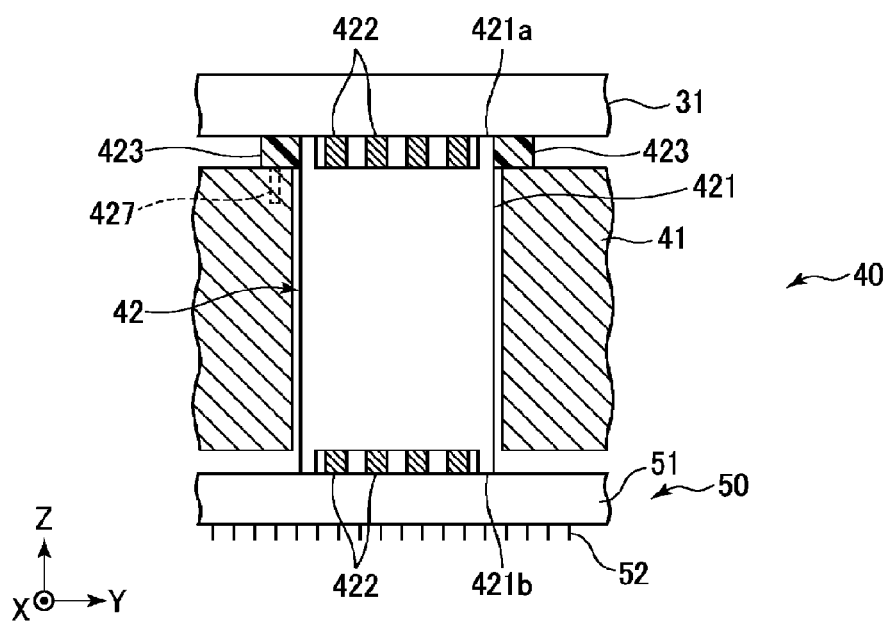
FIG. 5 is a schematic sectional view showing a state where the pogo block is inserted into the pogo frame.

FIG. 4 is a perspective view showing the pogo block 42, and FIG. 5 is a schematic sectional view showing a state in which the pogo block 42 is inserted into the pogo frame 41.

The pogo block 42 includes a guide member 421, connection terminals 422 and flanges 423.

The guide member 421 has a substantially rectangular parallelepiped shape as a whole, and has a long side and a short side in a plan view. A direction parallel to the long side is the X direction, and a direction parallel to the short side is the Y direction. A length of the long side is, for example, 50 mm or more, and a length of the short side is, for example, 20 mm or more. A frame 421a is formed at an upper end of the guide member 421 along an outer edge thereof. A plurality of connection terminals 422 are arranged in a space surrounded by the frame 421a. Further, a frame 421b is formed at the lower end of the guide member 421 along the outer edge thereof. A plurality of connection terminals 422 are arranged in a space surrounded by the frame 421b. The plurality of connection terminals 422 arranged in the space surrounded by the frame 421a and the plurality of connection terminals 422 arranged in the space surrounded by the frame 421b are respectively connected to one ends and the other ends of connection pins (not shown) provided inside the guide member 421.

When the tester mother board 31 (corresponding to a first member) and the intermediate connection member 40 are vacuum-attracted to each other and the intermediate connection member 40 and the probe card 50 (corresponding to a second member) are vacuum-attracted to each other, the terminals (corresponding to first terminals) of the tester mother board 31, the terminals (corresponding to second terminals) of the base 51 and the connection terminals 422 are connected to each other. At this time, the tester mother board 31 is in contact with the frame 421a, and the base 51 is in contact with the frame 421b.

The flanges 423 are made of resin and are provided so as to protrude outward of a pair of long sides on the top of the guide member 421.

Figure 6:
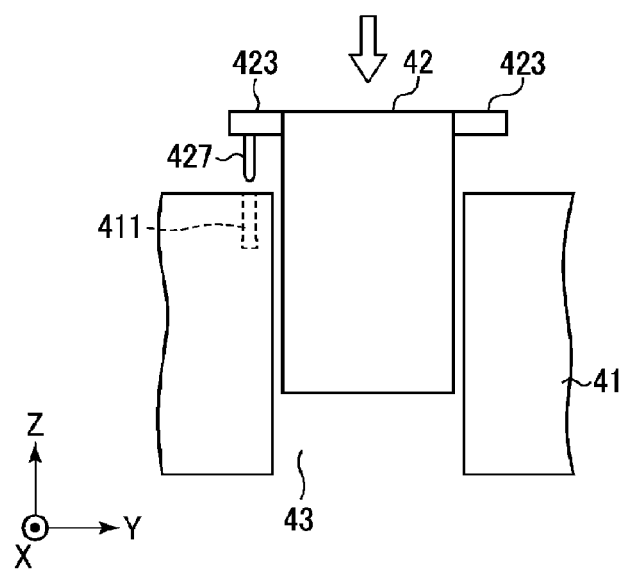
FIG. 6 is a schematic vertical longitudinal sectional view showing a state where the pogo block is being inserted into the insertion hole of the pogo frame.

FIG. 6 is a schematic longitudinal sectional view showing a state where the pogo block 42 is being inserted into the insertion hole 43 of the pogo frame 41. As shown in FIG. 6, the pogo block 42 is inserted into the insertion hole 43 of the pogo frame 41 from above so that the flanges 423 are locked to the upper surface of the pogo frame 41. A positioning pin 427 is provided on a lower surface of one of the flanges 423 so as to project downward. That is to say, the positioning pin 427 is provided in an area different from a connection pin arrangement area of the pogo block 42.

Figure 7:
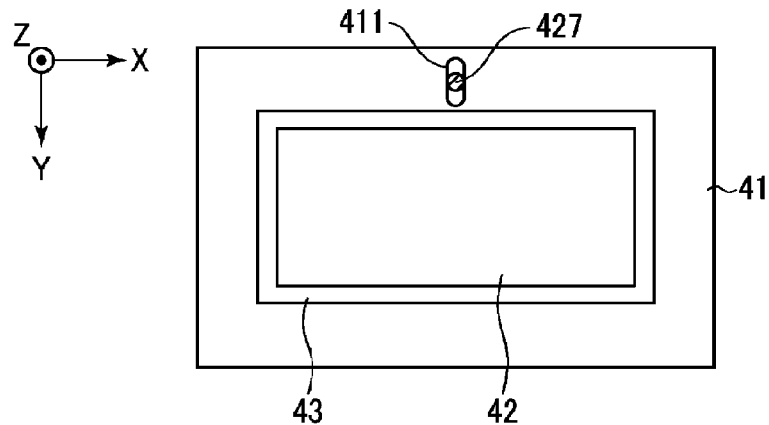
FIG. 7 is a horizontal sectional view schematically showing a height position of a positioning pin in the insertion hole when the pogo block is inserted into the insertion hole of the pogo frame.

FIG. 7 is a horizontal sectional view schematically showing a height position of the positioning pin 427 in the insertion hole 43 when the pogo block 42 is inserted into the insertion hole 43 of the pogo frame 41. As shown in FIGS. 6 and 7, a positioning hole 411 into which the positioning pin 427 is inserted is formed in the upper surface of the pogo frame 41 so as to correspond to the positioning pin 427.

As shown in FIG. 7, the positioning hole 411 is formed near the center in the long-side direction of the pogo block 42. The positioning hole 411 has an elongated hole shape in which the short-side direction of the pogo block 42, namely the Y direction, is the major axis direction. There is almost no gap between the positioning pin 427 and the positioning hole 411 in the X direction which is the long-side direction of the pogo block 42. Therefore, when the positioning pin 427 is inserted into the positioning hole 411, the positioning in the long-side direction of the pogo block 42, namely the X direction, is achieved. On the other hand, since the positioning hole 411 is an elongated hole extending in the Y direction, the positioning of the pogo block 42 in the Y direction is achieved by an inner wall (the tolerance of the inner wall) of the insertion hole 43 of the pogo frame 41.

The connection terminals 422 are provided to connect the terminals of the tester mother board 31 (the tester 30) and the terminals of the base 51 (the probe card 50). The terminals 422 constitute pogo pins as connectors. Typically, the pogo pin incorporates a spring and is connected to the terminals of the tester mother board 31 and the base 51 by virtue of an elastic force (biasing force) of the spring. In some embodiments, one obtained by plating, as a connection portion, an elastic material such as an elastic resin, may be used as the connection terminal 422. A connector using an elastic force of the elastic material may be also included in the pogo pin. Even in this case, the same effects as the typical pogo pin using a spring can be achieved.

In the inspection system 10 configured as above, in each inspection apparatus 20, the intermediate connection member 40 is constituted by inserting the pogo block 42 into the insertion hole 43 of the pogo frame 41. The intermediate connection member 40 and the tester mother board 31 are aligned and are vacuum-attracted to each other through the seal member 71. Further, the base 51 of the probe card 50 and the intermediate connection member 40 are aligned and vacuum-attracted to each other through the seal member 72.

In this state, the wafer W accommodated in the loader part 13 is taken out by the transfer mechanism (not shown) in the transfer part 14 and is delivered to the chuck top 60 on the aligner (not shown). Then, the wafer W in the X, Y and θ directions is aligned by the aligner. Subsequently, the aligner is raised to bring the probes 52 of the probe card 50 into contact with the electrodes of the DUTs formed on the wafer W. At the same time, the chuck top 60 is attracted by bringing the seal member 73 into contact with the pogo frame 41 of the intermediate connection member 40 and evacuating the space surrounded by the seal member 73. In this state, the tester 30 inspects the electrical characteristics of the DUTs formed on the wafer W.

In the inspection system 10, in the case where the inspection apparatus 20 inspects the wafer W, when a measurement temperature becomes high, relative positional deviation between the pogo frame 41 and the pogo block 42 occurs due to a difference in thermal expansion coefficient between the pogo frame 41 and the pogo block 42.

That is to say, the pogo frame 41 is made of a material having high strength, high rigidity and a small thermal expansion coefficient, such as a NiFe alloy, whereas the body of the pogo block 42 is made of a resin having a large thermal expansion coefficient. Thus, misalignment between the pogo pins and the terminals of the tester motherboard or the terminals of the probe card occurs due to a difference in thermal expansion therebetween at a high temperature. Specifically, while the thermal expansion coefficient of the pogo frame 41 is about $1.5 \times 10^{-6}$/cm, the thermal expansion coefficient of the pogo block 42 is about $20 \times 10^{-6}$/cm. Thus, misalignment corresponding to such a difference occurs.

Conventionally, as disclosed in Patent Document 1, the planar shape of the pogo block is square and the length of one side thereof is 20 mm or less. As such, the positioning of the pogo block was possible by strictly defining the size of the insertion hole of the pogo frame and the clearance between the insertion hole and the pogo block. That is to say, by positioning the pogo block with the inner wall (the tolerance of the inner wall) of the insertion hole of the pogo frame, it was possible to set the positional deviation between the pogo pins and the terminals of the tester mother board or the terminals of the probe card to fall within an allowable range.

However, with the progress of miniaturization and downsizing of semiconductor devices, an increase in the number of pins is required. Accordingly, an increase in size of the pogo block is required, and the planar shape of the pogo block is shifting from square to rectangular. For this reason, while the expansion amount itself of the pogo block by the thermal expansion of the pogo block becomes large, expansion amounts caused by horizontal and vertical thermal expansions differ from each other. Further, along with such increase in the number of pins, the diameter of an electrode pad itself becomes smaller. For this reason, it is difficult to set the positional deviation between the pogo pins and the terminals of the tester mother board or the terminals of the probe card due to the difference in thermal expansion to fall within the allowable range with positioning by only the inner wall of the insertion hole as in the conventional technique.

Therefore, in the present embodiment, the pogo block 42 is positioned by inserting the positioning pin 427, which is provided on the lower surface of the flange 423 outside the connection pin arrangement area of the pogo block 42, into the positioning hole 411 formed in the upper surface of the pogo frame 41.

At this time, the positioning hole 411 has an elongated hole shape in which the Y direction which is the short-side direction of the pogo block 42 is the major axis direction, and there is almost no gap between the positioning pin 427 and the positioning hole 411 in the X direction which is the long-side direction of the pogo block 42. Therefore, it is possible to position the pogo block 42 with high accuracy with respect to the pogo frame 41 in the X direction which is the long-side direction, thus setting the positional deviation between the pogo pins and the terminals of the tester mother board or the terminals of the probe card due to the thermal expansion difference in the long-side direction to fall within the allowable range.

On the other hand, since the Y direction which is the short-side direction of the positioning hole 411 is the major axis direction, the positioning pin 427 can escape in the Y direction which is the short-side direction. Therefore, the pogo block 42 is not restricted by the positioning pin 427 in the Y direction which is the short-side direction, but is positioned by the inner wall of the insertion hole 423 as in the conventional technique. That is to say, since the short side of the pogo block 42 is short, the positioning of the pogo block 42 by the inner wall of the fitting hole 423 is possible as in the conventional technique.

Thus, only by providing a single positioning pin 427 and forming the elongated positioning hole 411 corresponding to the single positioning pin 427, it is possible to set the positional deviation between the pogo pins and the terminals of the tester motherboard or the terminals of the probe card to fall within the allowable range in both the long-side direction and the short-side direction. However, the number of positioning pin 427 and the number of positioning holes 411 are not limited to one.

Next, another example of the intermediate connection member 40 will be described.

In this example, positioning is performed using the positioning pin and the positioning hole in both the long-side direction and the short-side direction.

Figure 8:
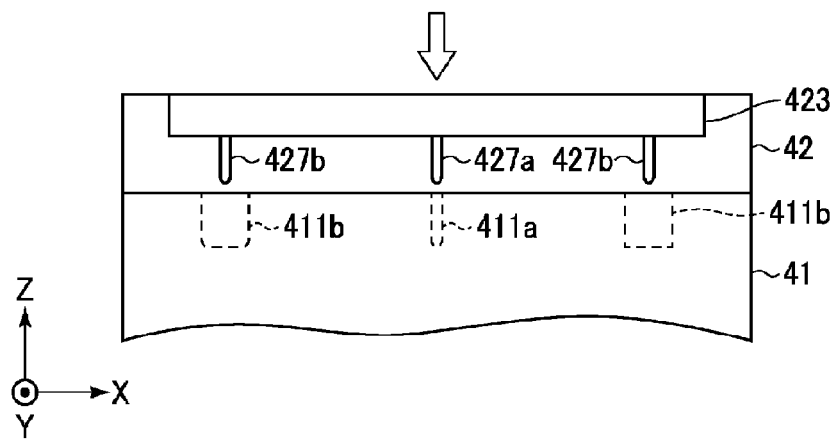
FIG. 8 is a schematic side view showing a state where a pogo block is being inserted into an insertion hole of a pogo frame in an intermediate connection member of another example.

Specifically, as shown in FIG. 8, on the lower surface of one flange 423 of the pogo block 42, a first positioning pin 427a is provided at the central side and two second positioning pins 427b are provided at both sides thereof.

Figure 9:
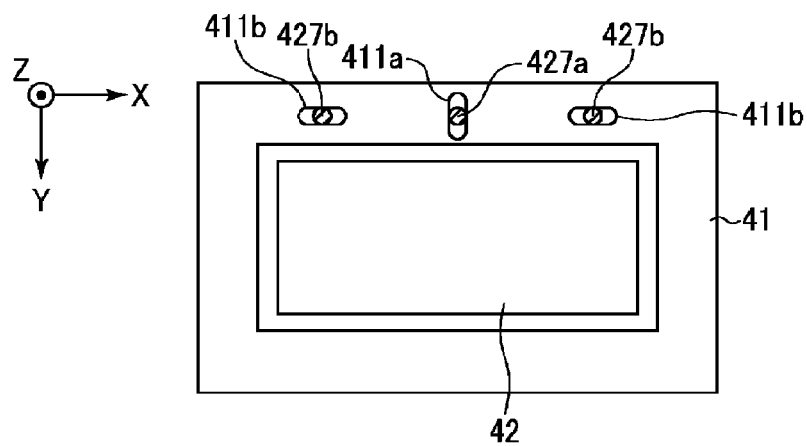
FIG. 9 is a horizontal sectional view schematically showing a height position of a positioning pin in the insertion hole when the pogo block is inserted into the insertion hole of the pogo frame in the intermediate connection member of another example.

On the other hand, as shown in FIG. 9, a first positioning hole 411a into which the first positioning pin 427a is inserted is formed at a position corresponding to the first positioning pin 427a on the upper surface of the pogo frame 41. Two second positioning holes 411b into which the second positioning pins 427b are inserted are formed at positions corresponding to the two positioning pins 427b on the upper surface of the pogo frame 41.

The first positioning hole 411a has an elongated hole shape in which the Y direction, which is the short-side direction of the pogo block 42, is the major axis direction. It is therefore possible to perform high-accurate positioning in the X direction which is the long-side direction. On the other hand, each of the second positioning holes 411b has an elongated hole shape in which the X direction, which is the long-side direction of the pogo block 42, is the major axis direction. It is therefore possible to perform high-accurate positioning in the Y direction which is the short-side direction.

Therefore, in this example, the accuracy of positioning can be enhanced in both the X direction and the Y direction, which makes it possible to set the positional deviation between the pogo pins and the terminals of the tester mother board or the terminals of the probe card to fall within the allowable range in a more reliable manner.

In this example, the number of first positioning pins 427a and the number of first positioning holes 411a are not limited to one, and the number of second positioning pins 427b and the number of second positioning holes 411b are limited to two. Further, in this example, the pogo block 42 is not limited to a rectangular shape in a plan view, but may have a square shape.

It should be noted that the embodiments disclosed herein are exemplary in all respects and are not restrictive. The above-described embodiments may be omitted, replaced or modified in various forms without departing from the scope and spirit of the appended claims.

For example, although in the above embodiments, the inspection apparatuses provided inside the inspection system having a plurality of inspection units have been described, the present disclosure is not limited thereto but may be applied to a single inspection apparatus.

Further, although the intermediate connection member for connecting the tester and the probe card in the inspection apparatus has been described in the above embodiments, the intermediate connection member is not limited thereto but may have any form as long as it can form electrical conduction.

According to the present disclosure in some embodiments, it is possible to suppress a positional deviation between a pogo frame and a pogo block due to a difference in thermal expansion therebetween, using an intermediate connection member obtained by inserting the pogo block into an insertion hole of the pogo frame

What is claimed is:

1. An intermediate connection member which is provided between a tester having a plurality of first terminals and a probe card having a plurality of second terminals and electrically connects the plurality of first terminals and the plurality of second terminals, respectively, the intermediate connection member comprising:
    a pogo block including a main body and a plurality of pogo pins provided in the main body, the pogo block configured to connect the plurality of first terminals and the plurality of second terminals, respectively; and
    a pogo frame having an insertion hole into which the pogo block is inserted and made of a material having a thermal expansion coefficient which is different from that of the pogo block,
    wherein the pogo block has a positioning pin, and the pogo frame has a positioning hole into which the positioning pin is inserted, and
    wherein the pogo block is positioned with respect to the pogo frame when the positioning pin is inserted into the positioning hole.

2. The intermediate connection member of claim 1, wherein the pogo block is formed in a rectangular shape having a long side and a short side in a plan view, and
    wherein the positioning hole has an elongated hole shape in which a major axis direction of the positioning hole is parallel to the short side.

3. The intermediate connection member of claim 1, wherein the pogo block has a rectangular shape or a square shape, which has a first side and a second side orthogonal to the first side in a plan view,
    wherein the positioning pin includes a first positioning pin and a second positioning pin,
    wherein the positioning hole includes a first positioning hole into which the first positioning pin is inserted and a second positioning hole into which the second positioning pin is inserted, and
    wherein the first positioning hole has an elongated hole shape in which a major axis direction of the first positioning hole is parallel to the first side, and the second positioning hole has an elongated hole shape in which a major axis direction of the second positioning hole is parallel to the second side.

4. The intermediate connection member of claim 1, wherein the positioning pin is provided in an area different from an area where the plurality of pogo pins of the pogo block are arranged.

5. The intermediate connection member of claim 4, wherein the pogo block includes a flange which is provided so as to protrude from the main body and is locked to the pogo frame when the pogo block is inserted into the insertion hole of the pogo frame, and the positioning pin is provided on the flange.

6. The intermediate connection member of claim 1, wherein each of the plurality of pogo pins includes a connection pin and connection terminals provided at both ends of the connection pin, and the main body of the pogo block is configured as a guide member of the connection pin.

7. An inspection apparatus comprising:
    a tester configured to apply an electrical signal to a plurality of devices formed on a substrate to test electrical characteristics of the plurality of devices;
    a probe card including probes to be in contact with electrodes of the plurality of devices formed on the substrate; and
    an intermediate connection member configured to electrically connect a plurality of terminals of the tester and a plurality of terminals of the probe card,
    wherein the intermediate connection member further comprises:
    a pogo block having a main body and a plurality of pogo pins provided on the main body, the pogo block being configured to connect the plurality of terminals of the tester and the plurality of terminals of the probe card; and a pogo frame having an insertion hole into which the pogo block is inserted and made of a material having a thermal expansion coefficient which is different from that of the pogo block, wherein the pogo block has a positioning pin, and the pogo frame has a positioning hole into which the positioning pin is inserted, and wherein the pogo block is positioned with respect to the pogo frame when the positioning pin is inserted into the positioning hole.

8. The inspection apparatus of claim 7, wherein the pogo block has a rectangular shape having a long side and a short side in a plan view, and wherein the positioning hole has an elongated hole shape in which a major axis direction of the positioning hole is parallel to the short side.

9. The inspection apparatus of claim 7, wherein the pogo block is formed in a rectangular shape or a square shape having a first side and a second side orthogonal to the first side in a plan view, wherein the positioning pin includes a first positioning pin and a second positioning pin, wherein the positioning hole includes a first positioning hole into which the first positioning pin is inserted and a second positioning hole into which the second positioning pin is inserted, and wherein the first positioning hole has an elongated hole shape in which a major axis direction of the first positioning hole is parallel to the first side, and the second positioning hole has an elongated hole shape in which a major axis direction of the second positioning hole is parallel to the second side.

10. The inspection apparatus of claim 7, wherein the positioning pin is provided in an area different from an area where the plurality of pogo pins of the pogo block are arranged.

11. The inspection apparatus of claim 10, wherein the pogo block comprises a flange which is provided so as to protrude from the main body and is locked to the pogo frame when the pogo block is inserted into the insertion hole of the pogo frame, and the positioning pin is provided on the flange.

12. The inspection apparatus of claim 7, wherein each of the plurality of pogo pins includes a connection pin and connection terminals provided at both ends of the connection pin, and the main body of the pogo block is configured to be a guide member of the connection pin.

* * * * *